United States Patent
Hsu et al.

(10) Patent No.: US 11,550,710 B2
(45) Date of Patent: Jan. 10, 2023

(54) DATA PROCESSING METHOD AND MEMORY CONTROLLER UTILIZING THE SAME

(71) Applicant: Realtek Semiconductor Corp., HsinChu (TW)

(72) Inventors: Wei-Ren Hsu, HsinChu (TW); Chih-Yen Chen, HsinChu (TW); Yen-Chung Chen, HsinChu (TW); Jiunn-Jong Pan, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 34 days.

(21) Appl. No.: 17/131,775

(22) Filed: Dec. 23, 2020

(65) Prior Publication Data

US 2021/0248064 A1 Aug. 12, 2021

Related U.S. Application Data

(60) Provisional application No. 62/970,714, filed on Feb. 6, 2020.

(30) Foreign Application Priority Data

Oct. 26, 2020 (TW) .................................. 109137029

(51) Int. Cl.
*G06F 12/02* (2006.01)
*G06F 12/0882* (2016.01)
(Continued)

(52) U.S. Cl.
CPC ...... *G06F 12/0246* (2013.01); *G06F 11/1068* (2013.01); *G06F 11/3037* (2013.01);
(Continued)

(58) Field of Classification Search
CPC ............ G06F 12/0246; G06F 12/0882; G06F 12/1458; G06F 2212/7201
See application file for complete search history.

(56) References Cited

U.S. PATENT DOCUMENTS

| | | | |
|---|---|---|---|
| 8,417,987 B1 * | 4/2013 | Goel ................... | G06F 11/1076 714/6.22 |
| 2013/0346671 A1 * | 12/2013 | Michael ................ | G06F 3/0679 711/E12.008 |

(Continued)

FOREIGN PATENT DOCUMENTS

TW 201222552 A1 6/2012

*Primary Examiner* — Nanci N Wong
(74) *Attorney, Agent, or Firm* — Winston Hsu

(57) ABSTRACT

A memory controller includes a memory interface and a processor. The processor is coupled to the memory interface and controls access operation of a memory device via the memory interface. The processor maintains a predetermined table according to write operation of a first memory block of the memory device and performs data protection in response to the write operation. When performing the data protection, the processor determines whether memory space damage has occurred in the first memory block. When it is determined that memory space damage has occurred in the first memory block, the processor traces back one or more data sources of data written in the first memory block according to the predetermined table to obtain address information of one or more source memory blocks and performs a data recovery operation according to the address information of the one or more source memory blocks.

17 Claims, 6 Drawing Sheets

(51) Int. Cl.
*G06F 12/14* (2006.01)
*G06F 11/10* (2006.01)
*G06F 11/30* (2006.01)

(52) U.S. Cl.
CPC ...... *G06F 12/0882* (2013.01); *G06F 12/1458* (2013.01); *G06F 2212/7201* (2013.01)

(56) References Cited

U.S. PATENT DOCUMENTS

| | | | |
|---|---|---|---|
| 2014/0119706 A1* | 5/2014 | Chang | H04N 5/907 |
| | | | 386/224 |
| 2015/0178189 A1* | 6/2015 | Lasser | G06F 11/1008 |
| | | | 714/6.11 |
| 2019/0026224 A1* | 1/2019 | Koo | G06F 3/0652 |
| 2020/0089581 A1* | 3/2020 | Lee | G11C 16/10 |
| 2021/0132848 A1* | 5/2021 | Cho | G06F 3/064 |

* cited by examiner

DATA PROCESSING METHOD AND MEMORY CONTROLLER UTILIZING THE SAME

CROSS REFERENCE TO RELATED APPLICATIONS

This application claims the benefit of U.S. Provisional Application No. 62/970,714 filed 2020 Feb. 6, the entirety of which is incorporated by reference herein.

BACKGROUND OF THE INVENTION

1. Field of the Invention

The invention relates to a data processing method, more particular to a data processing method for effectively protecting data stored in a memory device.

2. Description of the Prior Art

A certain percentage of memory cells will be physically damaged before the guaranteed lifespan of a flash memory device due to some manufacturing factors, causing the memory cells to no longer be used. If a memory cell has been written with valid data when the damage occurs, valid data loss will occur.

In order to protect the flash memory device from having valid data loss due to the damage of the memory cells, an existing technology uses the protection mechanism adopted by Redundant Array of Independent Disks (RAID) to protect the data stored in the flash memory device. In the protection mechanism adopted by RAID, parity information is calculated based on the data written in the flash memory device, and the parity information will be collectively stored in the flash memory device with the data protected by the parity information. In this manner, when damage occurs, the parity information can be used to reversely derive the content of lost valid data.

However, since the parity information also has to be stored in the flash memory device, the memory space that can actually be utilized for storing the valid data will be accordingly decreased when the protection mechanism is applied. In addition, operations of calculating, storing and reading the parity information also wastes the computation resources of the flash memory controller, further degrades the access speed of the flash memory device.

To solve the aforementioned problems, a novel data processing method for effectively protecting data stored in a memory device and avoiding the aforementioned memory space occupation and access speed degradation is required.

SUMMARY OF THE INVENTION

It is an objective of the invention to provide a data processing method for effectively protecting data stored in a memory device and to solve the aforementioned problems. The spirit of the proposed method is to use the property of the flash memory device to trace back the correct data when memory space damage has occurred. In this manner, the data repair rate can reach 100%. In addition, since the damaged data can be repaired without occupying extra memory space, the aforementioned problems of memory space occupation and access speed degradation are avoided.

According to an embodiment of the invention, a memory controller comprises a memory interface and a processor. The processor is coupled to the memory interface and configured to control access operation of a memory device via the memory interface. The processor is further configured to maintain a predetermined table according to a write operation of a first memory block of the memory device and perform data protection in response to the write operation. When performing the data protection, the processor is configured to determine whether memory space damage has occurred in the first memory block. When it is determined that memory space damage has occurred in the first memory block, the processor is configured to trace back one or more data sources of data written in the first memory block according to the predetermined table to obtain address information of one or more source memory blocks and perform a data recovery operation according to the address information of the one or more source memory blocks.

According to another embodiment of the invention, a data processing method, for a memory controller coupled to a memory device and comprising a processor to control access operation of the memory device and performed by the processor, comprises: maintaining a predetermined table according to a write operation of a first memory block of the memory device; and performing data protection in response to the write operation. Step of performing the data protection in response to the write operation further comprises: determining whether memory space damage has occurred in the first memory block. When it is determined that memory space damage has occurred in the first memory block, the data processing method further comprises tracing back one or more data sources of data written in the first memory block according to the predetermined table to obtain address information of one or more source memory blocks; and performing a data recovery operation according to the address information of the one or more source memory blocks.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
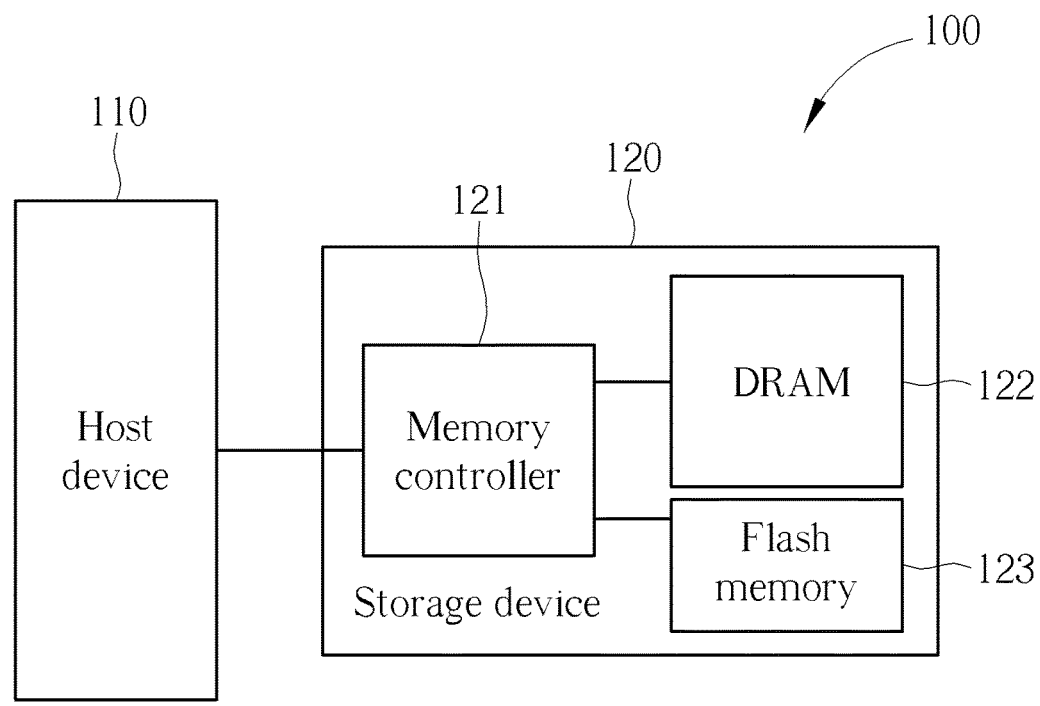
FIG. 1 is a block diagram of a system according to an embodiment of the invention.

FIG. 1 is a block diagram of a system according to an embodiment of the invention. The system may be a data storage system, a computer system or an electronic product system. The system 100 may comprise a host device 110 and a storage device 120. The storage device 120 may comprise a memory controller 121 and one or more memory devices. According to an embodiment of the invention, the storage device 120 may be a Solid State Drive (SSD) configured inside of the electronic product or connected to the electronic product. The memory controller 121 may be coupled to said one or more memory devices. The memory devices may be a Dynamic Random Access Memory (DRAM) 122 and a flash memory 123 as shown in FIG. 1, and the flash memory 123 may comprise a plurality of flash memory module. The memory controller 121 may access the DRAM 122 and flash memory 123 via the corresponding interfaces. The memory controller 121 may also communicate with the host device 110 via the corresponding interface, for receiving a plurality of commands and performing corresponding memory access operations in response to the commands.

It should be noted that FIG. 1 presents a simplified block diagram in which only the components relevant to the invention are shown. As will be readily appreciated by a person of ordinary skill in the art, an electronic product system may further comprise other components not shown in FIG. 1 and configured to implement a variety of functions.

Figure 2:
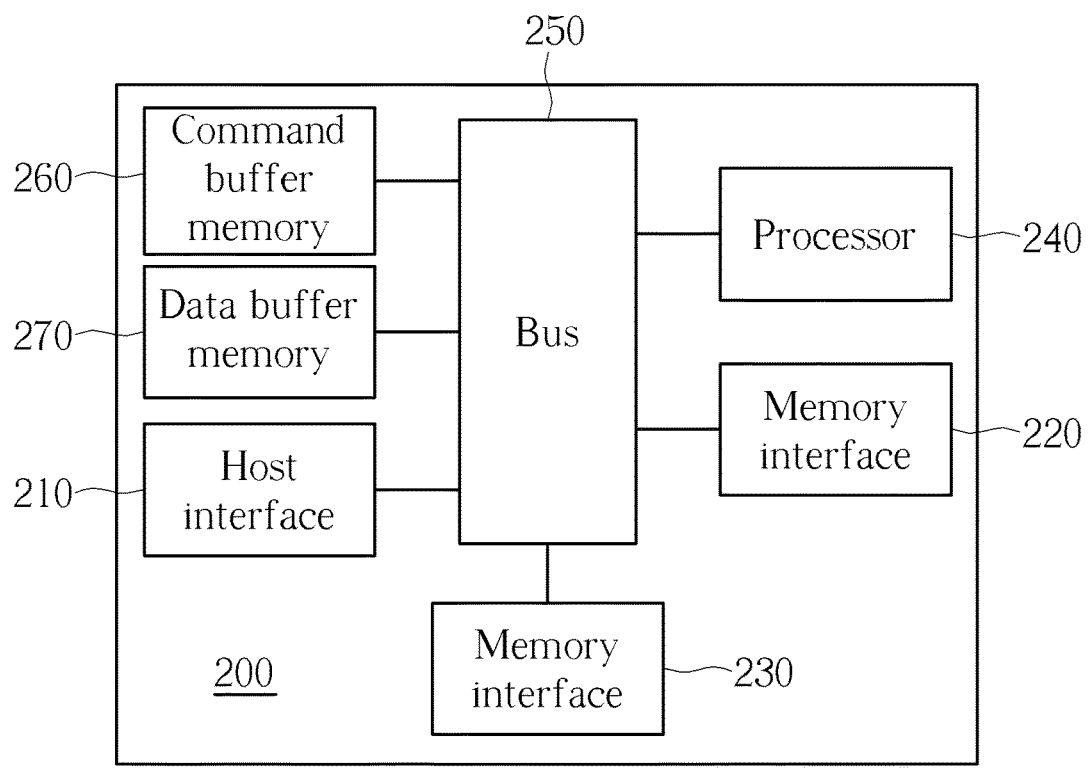
FIG. 2 is an exemplary block diagram of a memory controller according to an embodiment of the invention.

FIG. 2 is an exemplary block diagram of a memory controller according to an embodiment of the invention. The memory controller 200 may be one of a variety of implementations of the memory controller 121 shown in FIG. 1. The memory controller 200 may comprise a plurality of interfaces, such as the host interface 210 and the memory interfaces 220 and 230, wherein the host interface 210 may be coupled to the host device 110 and the memory interfaces 220 and 230 may be coupled to the corresponding memory devices. The memory controller 200 may communicate with peripheral devices via the aforementioned interfaces. The host interface 210 may be implemented by a controller, such as a Peripheral Component Interconnect (PCI) Express (PCI-E) interface/Serial Advanced Technology Attachment (SATA) controller, and is configured to control the communication signals transmitted between the memory controller 200 and the host device 110 via the corresponding hardware interface. The memory controller 200 may receive a plurality of commands from the host device 110 via the host interface 210. The memory interface 220 may be implemented by a DRAM controller, and is configured to control the communication signals transmitted between the memory controller 121/200 and the DRAM 122 via the corresponding hardware interface. The memory interface 230 may be implemented by a flash memory controller, and is configured to control the communication signals transmitted between the memory controller 121/200 and the flash memory 123 via the corresponding hardware interface.

The memory controller 200 may further comprise a processor 240, a bus 250, a command buffer memory 260 and a data buffer memory 270. The processor 240 is configured to communicate with the peripheral devices via the bus 250 and the aforementioned interfaces. For example, the processor 240 may control the access operation of the memory device (such as the flash memory 123) via the memory interface (such as the memory interface 230). The bus 250 may operate in compliance with the Open Core Protocol (OCP) and may be utilized to connect the devices such as the host interface 210, the memory interfaces 220 and 230, the processor 240, the command buffer memory 260 and the data buffer memory 270, so that they can communicate and collaborate with each other. The command buffer memory 260 and the data buffer memory 270 may be utilized to perform the command and data buffering required by the memory controller 200. The command buffer memory 260 and the data buffer memory 270 may be implemented by RAM, such as the static RAM (SRAM), but the invention should not be limited thereto.

It should be noted that FIG. 2 presents a simplified block diagram in which only the components relevant to the invention are shown. As will be readily appreciated by a person of ordinary skill in the art, a memory controller may further comprise other components not shown in FIG. 2 and configured to implement a variety of functions.

In order to protect the data stored in the memory device (such as the flash memory 123), while avoiding the aforementioned problems of memory space occupation and memory access speed degradation, in the embodiments of the invention, the processor 240 may perform data protection in response to the write operations of the memory device, and use properties of the flash memory to perform data recovery operation when detecting memory space damage has occurred in a memory block, so that user data will not be lost due to the damage.

Figure 3:
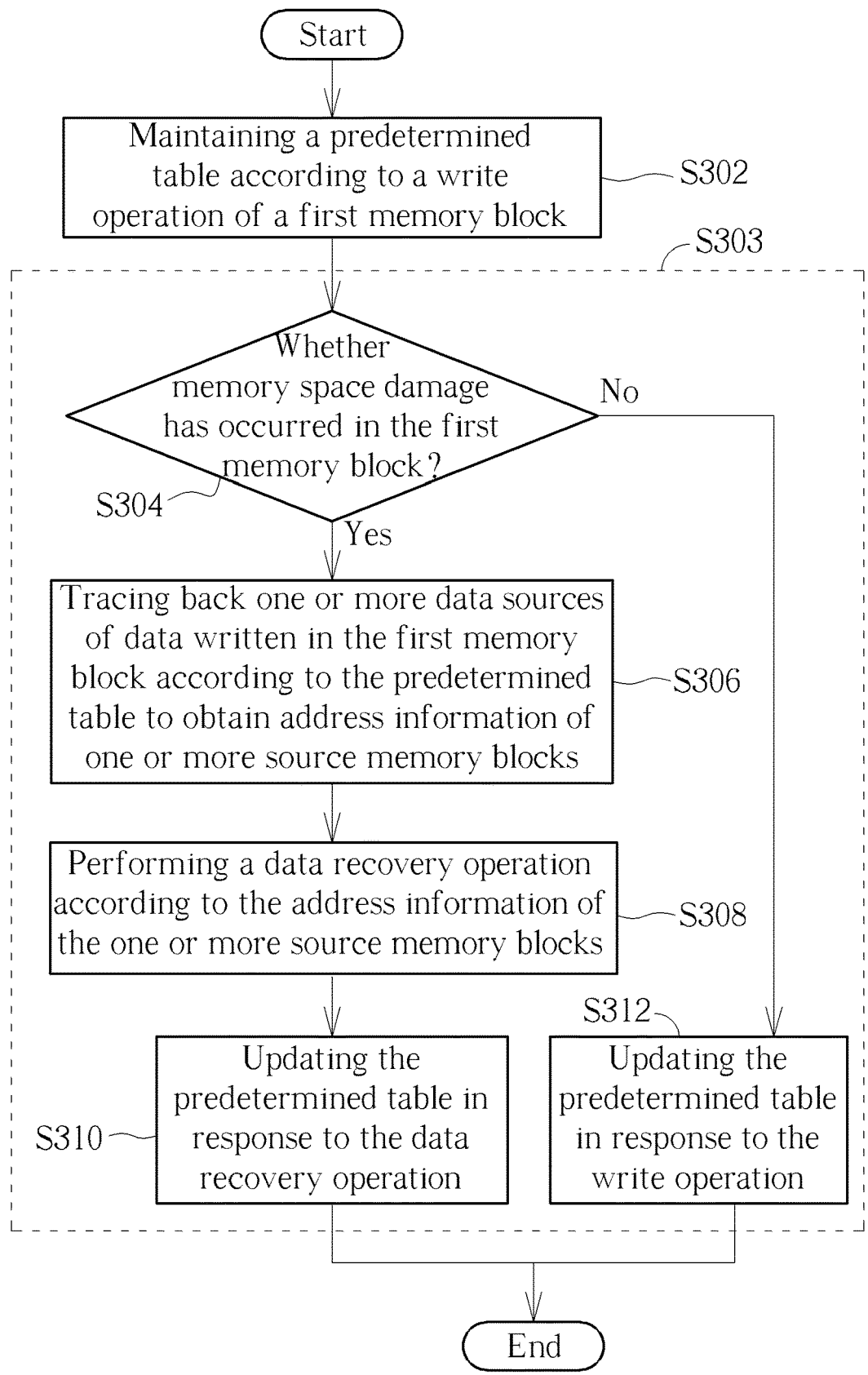
FIG. 3 is an exemplary flow chart of the data processing method according to an embodiment of the invention.

FIG. 3 is an exemplary flow chart of the data processing method according to an embodiment of the invention. The proposed data processing method is for the memory controller 121/200 and may comprise the following steps performed by the processor 240:

Step S302: Maintaining a predetermined table according to a write operation of a first memory block of the memory device. In the embodiments of the invention, the predetermined table may be a multi-party mapping table or a logical-to-physical (L2P) mapping table, and the aforementioned "maintaining" may be that accordingly updating the content recorded in the predetermined table based on the write operation.

Step S303: Performing data protection in response to the write operation of the first memory block. In the embodiments of the invention, step S303 may further comprise the following operations:

Step S304: Determining whether memory space damage has occurred in the first memory block. If yes, step S306 is performed. If no, step S312 is performed.

Step S306: Tracing back one or more data sources of data written in the first memory block according to the content recorded in the predetermined table to obtain address information of one or more source memory blocks.

Step S308: Performing a data recovery operation according to the address information of the one or more source memory blocks.

Step S310: Updating the predetermined table in response to the data recovery operation.

Step S312: Updating the predetermined table in response to the write operation.

It should be noted that in different embodiments of the invention, performance of steps S310 and S312 may be flexibly adjusted. For example, in some embodiments of the invention, performance of steps S310 and S312 may be skipped. Or, in some other embodiments of the invention, when the predetermined table is a multi-party mapping table, step S310 and/or step S312 may further comprise the operation of updating the L2P mapping table.

Generally, when the data is moved between different memory areas (for example, different memory blocks) within the memory device, the operation of data movement may be a part of the operations of Garbage Collection (GC) that is triggered due to insufficient memory space, or a part of the operations of wear leveling, or a part of the operations of data movement triggered when one or more active blocks are full, for moving the data in the active blocks to other memory blocks in a manner of better memory space utilization, or others, where the active blocks are configured to receive the data from the host device 110, and the memory blocks with lower space utilization but have better data protection capability (for example, the Single-Level Cell (SLC)) are selected as active blocks.

In the embodiments of the invention, the aforementioned write operation may be the write operation performed for writing the data copied from the source memory block to the destination memory block. Since the data movement is only a parallel movement of the data, the content of the data has not been changed. Therefore, in the embodiments of the invention, the processor 240 may record the original location of the data. When any memory space damage is found during the procedure of moving the data to a new area (for example, the destination memory block), since the same data is still stored in the old area (for example, the source memory block) and the content of the data stored in the old area is correct, the processor 240 may trace back to the old area to obtain the correct data for the data recovery operation. In this manner, data protection in the highest level is achieved. In addition, since the data recovery operation technically utilize the property of the flash memory (that is, performing the data movement operations to optimize the memory space utilization of the flash memory, and the original data will not be erased immediately but just recorded as invalid data or only the link to the original data is deleted after the data movement operation), in the embodiment of the invention, the damaged data can be repaired without occupying extra memory space, and the repair rate or recovery rate can reach 100%.

In some embodiments of the invention, the aforementioned predetermined table may be a multi-party mapping table. The multi-party mapping table may comprise a plurality of multi-party mapping records. Each multi-party mapping record may at least comprise a first field storing a logical address, a second field storing a source physical address and a third field storing a destination physical address, and the aforementioned three fields may be utilized for recording data corresponding to the recorded logical address has been moved from which source physical address (that is, the source physical address recorded in the second field) to which destination physical address (that is, the destination physical address recorded in the third field). According to an embodiment of the invention, the multi-party mapping table may be stored in the data buffer memory 270 or the flash memory 123. For example, the processor 240 may use each memory cell in a memory block to store one multi-party mapping record.

Besides the aforementioned predetermined table, the processor 240 may further maintain an L2P mapping table for the memory device (for example, the flash memory 123). The L2P mapping table is usually stored in the flash memory 123, and when updating the content of the L2P mapping table is required, the processor 240 may load the L2P mapping table into the data buffer memory 270 for editing it.

According to an embodiment of the invention, the L2P mapping table may correspond to a plurality of logical addresses (or, a plurality of logical pages) for recording mapping information regarding which physical address the logical addresses (or, the logical pages) are respectively mapped to. For example, the L2P mapping table may comprise a plurality of fields. Each field may correspond to one logical page, for recording the mapping information of this logical page. That is, which physical address of the flash memory 123 the data of this the logical address is directed to (or, actually stored in), wherein a logical page may be a basic access unit for accessing the flash memory 123 from the perspective of the host device 110. One logical page may be represented by a corresponding logical address, or may be represented by any other format that can direct to this logical page, and the physical address may be represented by the memory block number and physical page number, or may be represented by any other format that can direct to the physical address.

In the first embodiment of the invention, the processor 240 may maintain both the multi-party mapping table and the L2P mapping table according to the write operation of the first memory block. To be more specific, when performing the write operation of the first memory block, the processor 240 writes the data corresponding to one or more logical addresses into the first memory block. In response to the write operation of the first memory block, the processor 240 stores each logical address, information regarding source of the data corresponding to each logical address (for example, the memory block number of a source memory block and the physical page number of the physical page storing the data) and information regarding destination of the data corresponding to each logical address (for example, the memory block number of a destination memory block and the physical page number of the physical page storing the data) respectively in the first field, the second field and the third field of one multi-party mapping record in the multi-party mapping table.

In addition, the processor 240 may further update the mapping information of the one or more logical addresses in the L2P mapping table to corresponding one or more physical addresses of the first memory block in response to the write operation of the first memory block. For example, the aforementioned physical addresses recorded in the L2P mapping table may comprise the memory block number of the first memory block and the physical page number of the pages storing the data.

In the first embodiment of the invention, when the processor 240 determines that memory space damage has occurred in the first memory block, the processor 240 may trace back one or more data sources of the data written in the first memory block according to the information recorded in the multi-party mapping table to obtain address information of one or more source memory blocks, and modify the mapping information of the one or more logical addresses in the L2P mapping table to one or more physical addresses of the one or more source memory blocks according to the obtained address information of one or more source memory blocks. In this manner, the source of the data is traced back to the correct data stored in the source memory block.

After that, when performing the data recovery operation, the processor 240 may select another memory block (for example, the second memory block), read the data that was previously written in the first memory block from the one or more source memory blocks, and write the data that is read from the one or more source memory blocks into the second memory block. That is, the same data that was previously written in the first memory block is now rewritten to the second memory block.

It should be noted that the processor 240 may further maintain a multi-party mapping table and/or the L2P mapping table in response to the write operation of the second memory block in a similar manner as discussed above, and may perform data protection in response to the write operation of the second memory block.

On the other hand, when the processor 240 determines that memory space damage has not occurred in the first memory block, or when the data recovery operation is completed, the processor 240 may clear the content recorded in the multi-party mapping table. For example, the processor 240 may clear content related to one or more logical addresses of the data written in the first memory block, or may just clear the content related to the source physical addresses of the one or more logical addresses.

Figure 4:
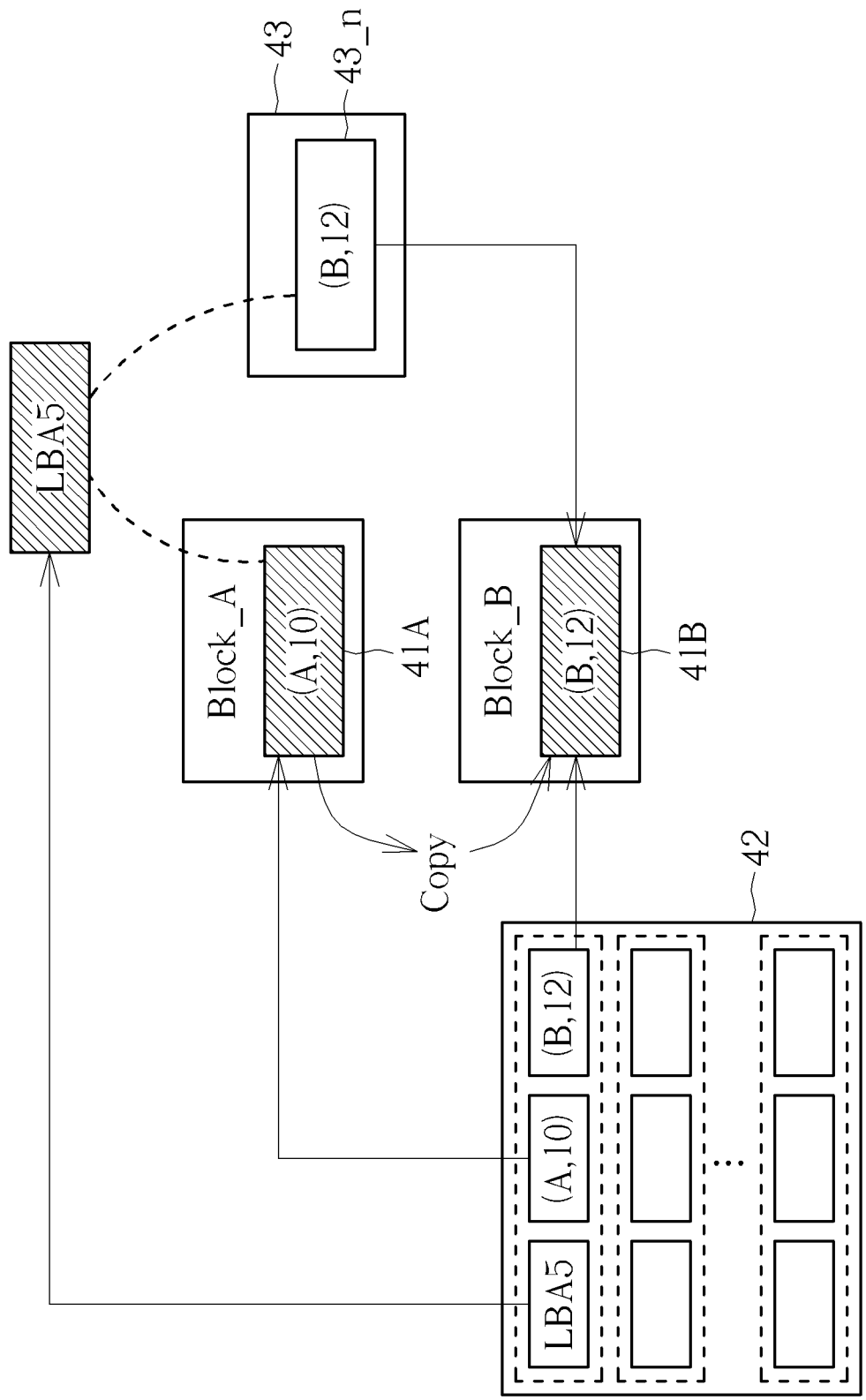
FIG. 4 is a schematic diagram showing the recorded mapping information according to the first embodiment of the invention.

FIG. 4 is a schematic diagram showing the recorded mapping information according to the first embodiment of the invention.

Suppose that the processor 240 is performing the data movement operation for moving data from the memory block Block_A to the memory block Block_B. As discussed above, the data movement operation may comprise the operations of reading the copying the data from the source memory block Block_A, and writing the data in the destination memory block Block_B. One data written in the memory block Block_B is utilized in FIG. 4 for illustration. As shown in FIG. 4, suppose that data 41A is the data corresponding to the logical address LA5 and is originally stored in the memory block Block_A. The physical address corresponding to the data 41A may be represented as (A, 10). Due to the data movement operation, the data is copied and written into the memory block Block_B as the data 41B, and the physical address corresponding to the data 41B may be represented as (B, 12).

The processor 240 maintains the multi-party mapping table 42 according to the write operation. The multi-party mapping table 42 may comprise a plurality of multi-party mapping records. Each multi-party mapping record may comprise at least three fields. The first field stores information regarding the logical address. For example, the logical address LA5. The second field records information regarding source physical address. For example, the physical address (A, 10) corresponding to the data 41A. The third field records information regarding destination physical address. For example, the physical address (B, 12) corresponding to the data 41B. Via the content recorded in the multi-party mapping table 42, the processor 240 is able to trace back to the source of correct data when memory space damage has occurred.

In the first embodiment of the invention, the processor 240 may also maintains the L2P mapping table 43 according to the write operation, so as to update the mapping information of the logical addresses involved in the write operation in the L2P mapping table 43 to one or more physical addresses of the memory block Block_B. Suppose that the field 43_n in the L2P mapping table 43 corresponds to the logical address LA5 for recording the mapping information of the logical address LA5, the processor 240 may update the content of the field 43_n corresponding to the data 41B to the physical address (B, 12) in response to the write operation.

Figure 5:
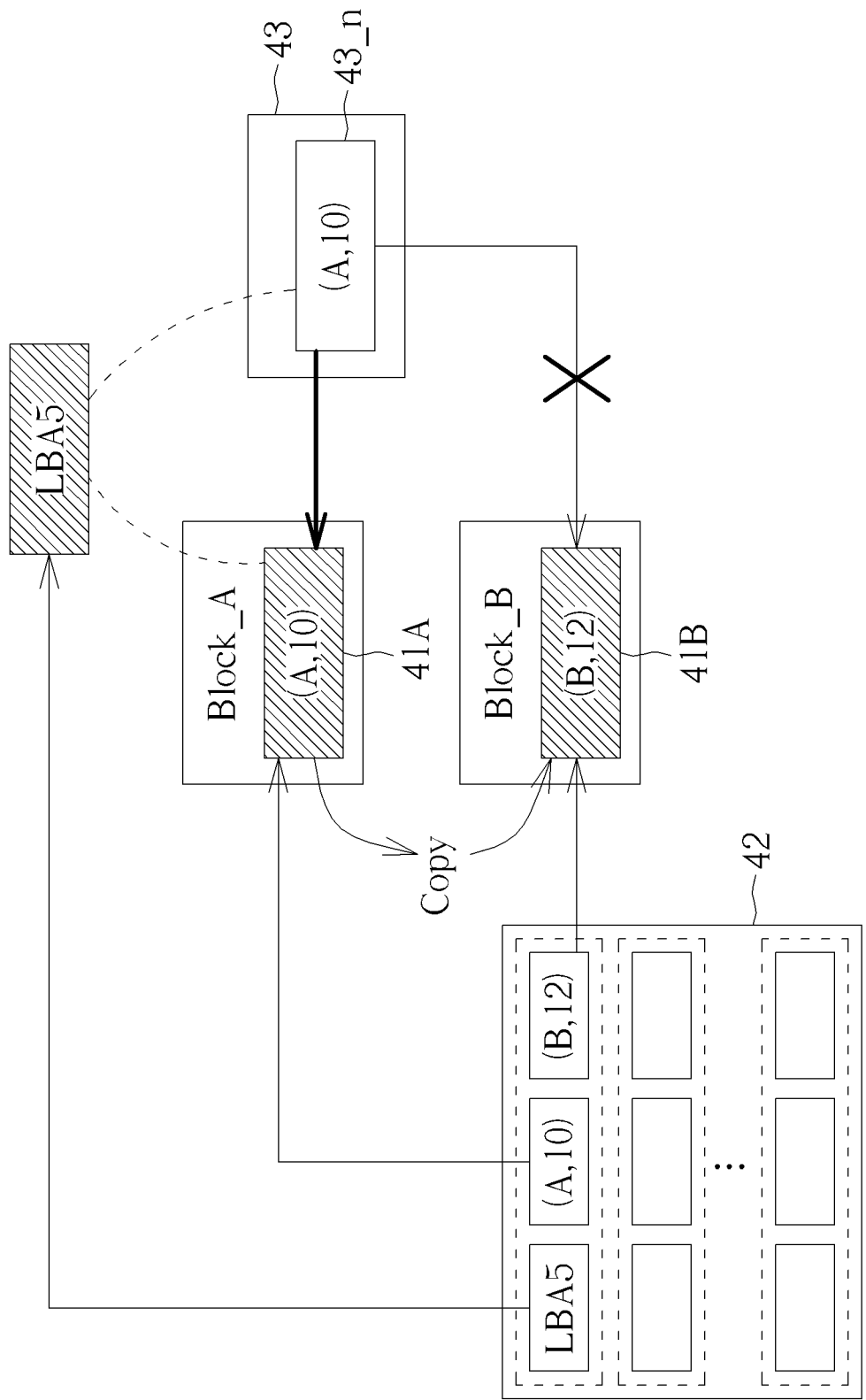
FIG. 5 is a schematic diagram showing the exemplary operation of modifying the mapping information when it is determined that memory space damage has occurred in the memory block according to the first embodiment of the invention.

FIG. 5 is a schematic diagram showing the exemplary operation of modifying the mapping information when it is determined that memory space damage has occurred in the memory block Block_B according to the first embodiment of the invention.

When the processor determines that memory space damage has occurred in the memory block Block_B, the processor may trace back one or more data source of the data written in the memory block Block_B according to the content recorded in the multi-party mapping table 42, to obtain address information of one or more source memory blocks. For example, based on the content recorded in the multi-party mapping table 42, the processor 240 knows that the data source of the data 41B corresponding to the physical address (B, 12) is the data 41A stored in the physical address (A, 10). In addition, the processor 240 may further modify the mapping information of one or more logical addresses involved in the write operation in the L2P mapping table 43 by changing it back to one or more physical address of the source memory block, so that the mapping information is directed to the address storing correct data. For example, as shown in FIG. 5, the content of the field 43_n is changed backed to the physical address (A, 10) corresponding to the data 41A. In this manner, the data source can be traced back to the correct data stored in the source memory block.

After that, when performing the data recovery operation, the processor 240 may select another memory block, for example, the memory block Block_C, reading the data that was previously written in the memory block Block_B from the one or more source memory blocks (for example, the memory block Block_A) according to the content recorded in the multi-party mapping table 42 or the L2P mapping table 43, and write the data that is read from the one or more source memory blocks in the memory block Block_C.

On the other hand, when the processor 240 determines that memory space damage has not occurred in the memory block Block_B, or when the data recovery operation is completed, the processor 240 may clear the content recorded in the multi-party mapping table 42. For example, the processor 240 may clear content related to one or more logical addresses of the data written in the memory block Block_B, or may just clear the content related to the source physical addresses thereof.

Different from the first embodiment, in the second embodiment of the invention, the processor 240 may maintain the multi-party mapping table 42 according to the write operation of the first memory device, but the processor does not update the mapping information of one or more logical addresses involved in the write operation of the first memory block in the L2P mapping table to one or more physical addresses of the first memory block before determining or confirming that the memory space damage has not occurred in the first memory block. That is, the processor 240 may temporarily keep the original content recorded in the L2P mapping table. When the processor 240 determines or confirms that the memory space damage has not occurred in the first memory block, the processor 240 updates the mapping information corresponding to the one or more logical addresses in the L2P mapping table to the one or more physical addresses of the first memory block.

Figure 6:
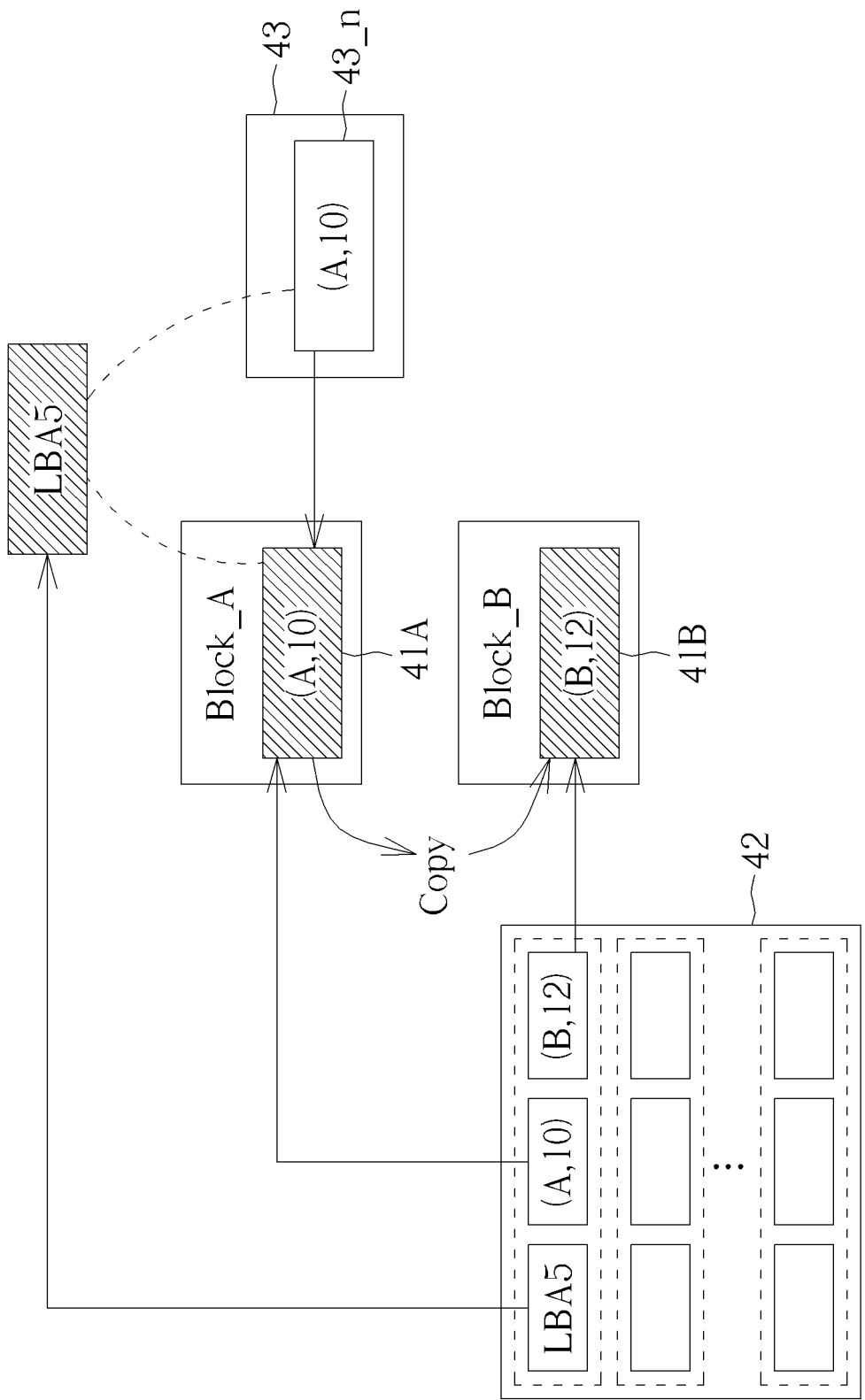
FIG. 6 is a schematic diagram showing the recorded mapping information according to the second embodiment of the invention.
Figure 7:
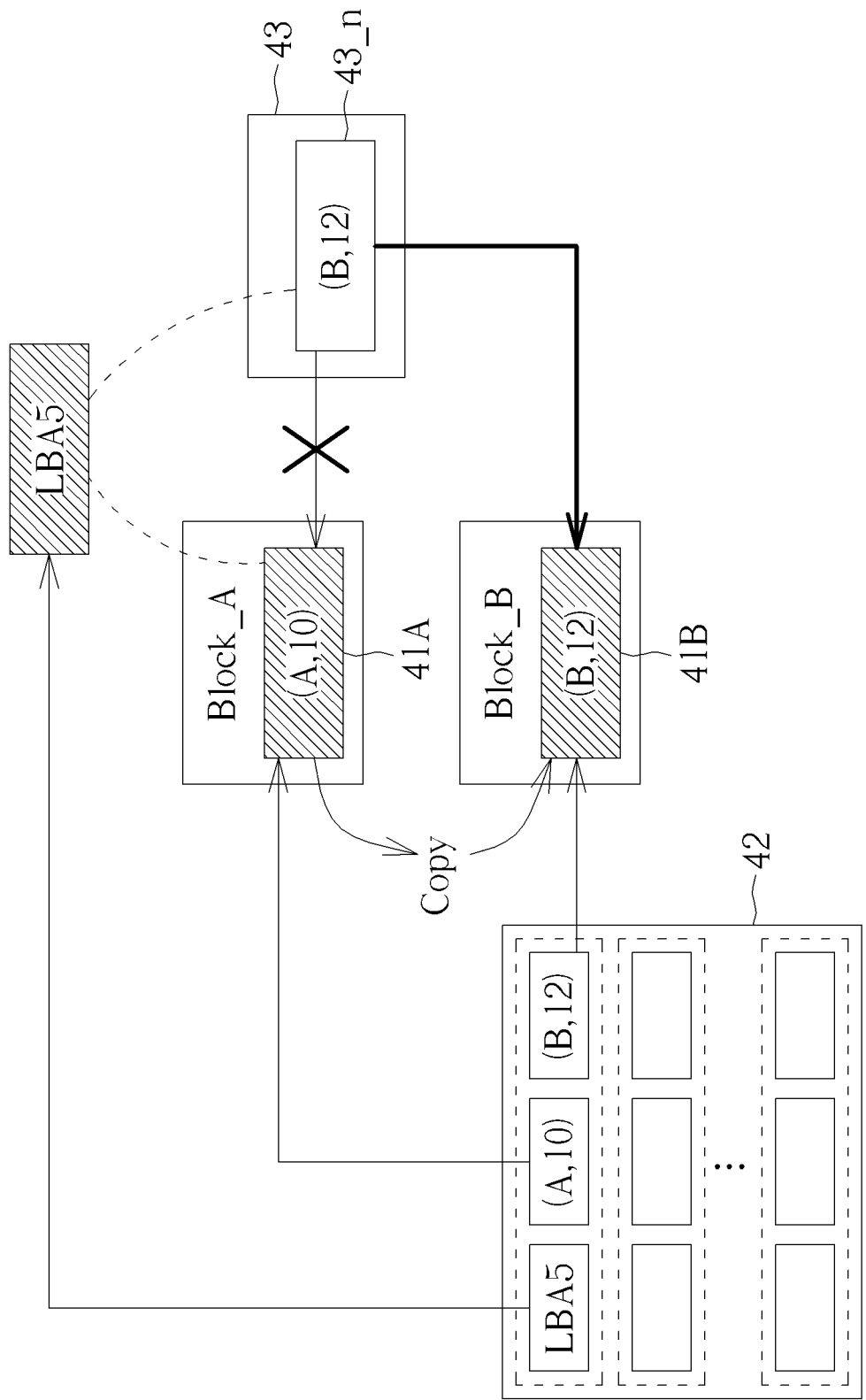
FIG. 7 is a schematic diagram showing the exemplary operation of modifying the mapping information when it is determined that memory space damage has not occurred in the memory block according to the second embodiment of the invention.

FIG. 6 is a schematic diagram showing the recorded mapping information according to the second embodiment of the invention. FIG. 7 is a schematic diagram showing the exemplary operation of modifying the mapping information when it is determined that memory space damage has not occurred in the memory block Block_B according to the second embodiment of the invention. Some of the contents shown in FIG. 6 and FIG. 7 are the same as those shown in FIG. 4 and FIG. 5. For the descriptions of the same content, reference may be made to the descriptions of FIG. 4 and FIG. 5, and are omitted here for brevity.

As shown in FIG. 6, in the second embodiment of the invention, before determining or confirming that the memory space damage has not occurred in the memory block Block_B, the processor 240 does not update the content of the field 43_n to the physical address (B, 12) corresponding to the data 41B in response to the write operation, and just temporarily keep the original content, for example, the physical address (A, 10) corresponding to the data 41A, recorded therein. In this manner, when detecting that the memory space damage has occurred in the memory block Block_B, the data source may be traced back to the source memory block storing correct data according to the content recorded in the multi-party mapping table 42 or the content recorded in the L2P mapping table 43.

After determining or confirming that the memory space damage has not occurred in the memory block Block_B, the processor 240 modifies the mapping information of one or more logical addresses involved in the write operation of the memory block Block_B in the L2P mapping table 43 to one or more physical address of the memory block Block_B.

In the third embodiment of the invention, the processor 240 may just maintain the L2P mapping table according to the write operations, and does use an extra memory space to maintain a multi-party mapping table. Therefore, in the third embodiment of the invention, the aforementioned predetermined table is the L2P mapping table. In the third embodiment of the invention, the method of recording the mapping information is the same as that illustrated in the second embodiment of the invention. Therefore, the exemplary mapping information recorded in the L2P mapping table 43 may refer to FIG. 6 and FIG. 7.

In the third embodiment of the invention, before determining or confirming that the memory space damage has not occurred in the memory block Block_B, the processor 240 does not update the content of the field 43_n to the physical address (B, 12) corresponding to the data 41_B in response to the write operation, and just temporarily keep the original content recorded therein, for example, the physical address (A, 10) corresponding to the data 41A. In this manner, when detecting that the memory space damage has occurred in the memory block Block_B, the data source may be traced back to the source memory block storing correct data according to the content recorded in the L2P mapping table 43.

After determining or confirming that the memory space damage has not occurred in the memory block Block_B, the processor 240 modifies the mapping information of one or more logical addresses involved in the write operation of the memory block Block_B in the L2P mapping table 43 to one or more physical address of the memory block Block_B. For example, when updating the mapping information, the processor 240 may read the recorded logical locations in the new data (for example, recorded logical addresses corresponding to the data stored in the memory block Block_B) and change the content corresponding to the logical locations in the L2P mapping table 43 to the new locations (for example, the physical addresses of the memory block Block_B that is corresponding to the logical addresses) based on the obtained logical locations.

In the embodiment of the invention, the processor 240 may check, determine or confirm whether memory space damage has occurred in the written memory block (for example, the aforementioned first memory block or the aforementioned memory block Block_B) according to one or a combination of multiple different methods illustrated as follows. For example, the processor 240 may check whether the status returned by the memory device is correct after each new memory space has been written, so as to determine whether memory space damage has occurred. For example, the memory device may transmit a write success or write fail message, or a write complete or a write incomplete message after performing a write operation. When the processor 240 receives the write fail message or the write incomplete message, the processor 240 may determines that memory space damage has occurred in the written memory block.

In addition, after each new memory space has been written, the processor 240 may further read the data that has just been written in the new memory space and check whether the data is correct, so as to determine whether memory space damage has occurred. That is, there is no need for the processor 240 to check the correctness of the data after one memory block is full (that is, the entire memory block has been written with data). The processor 240 may do the aforementioned data correctness check one or multiple times before a memory block is full. For example, after performing a write operation of the memory device, for example, after completing write operation of one or more pages, the processor 240 may read data stored in the one or more pages and determine whether the data is correct or has a good status according to the read content. When the processor 240 determines that the data is incorrect or has a bad status, or the data stored in any of the one or more pages has been damaged, the processor 240 may determine that the memory space damage has occurred or is very likely to occur or to have occurred in the written memory block. When the processor 240 determines that memory space damage is very likely to occur or is very likely to have occurred in a memory block, the aforementioned data processing method may also be applied to trace back the source of the correct data and the proposed data recovery operation may also be activated.

In addition, after the write operation of an entire memory space is completed, the processor 240 may read all the data stored in the entire memory space to determine whether all the data is correct and has a good status, so as to determine whether the memory space damage has occurred. For example, the processor 240 may read all the data stored in a memory block and determine whether all the data is correct or has a good status based on the read content after completing the write operation of an entire memory block or after a memory block (for example, the destination memory block) is full. When the processor 240 determines that any data is incorrect or has a bad status, the processor 240 may determine that memory space damage has occurred or is very likely to occur or to have occurred in the written memory block.

In the embodiments of the invention, the processor 240 may determine whether the data is correct or has a good status by analyzing or decoding the read data. For example, the processor 240 may use a decoder to perform Error Correction Code (ECC) decoding for decoding the read data, calculate a total number of the error bits, the number of correctable error bits, and/or the number of uncorrectable error bits of a memory space (for example, one or more pages), and determine whether the data is correct or has a good status based on the these results. When the total number of the error bits or the number of uncorrectable error bits is greater than a corresponding threshold, it is determined that the data is incorrect or has a bad status. For another example, the processor 240 may analyze the voltage level or the distribution of the threshold voltages of the data to determine the extent of drift in the voltage level of the data or the threshold voltage, and determine whether the data is correct or has a good status according to the determination results. When the voltage drift is greater than a corresponding threshold, it is determined that the data is incorrect or has a bad status. For another example, the processor 240 may compare the data read from the destination memory block with the data originally stored in the source memory block to determine whether the data is correct or has a good status. When the amount of difference between the data read from the destination memory block and the original data stored in the source memory block is greater than a corresponding threshold, it is determined that the data is incorrect or has a bad status. When the processor 240 determines that any data is incorrect or has a bad status, the processor may determine that memory space damage has occurred or is very likely to occur or to have occurred in the written memory block. When the processor 240 determines that memory space damage has occurred or is very likely to occur or to have occurred in a memory block, the aforementioned data processing method may also be applied to trace back the source of the correct data and the proposed data recovery operation may also be activated.

As discussed above, the problems of extra memory space occupation and access speed degradation exists in the conventional design which uses the parity information to protect data. In addition, the data protection method using the parity information is only effective when the error rate is lower than a predetermined level, and thus, it cannot achieve a 100% data repair rate. As compared to the conventional design, in the proposed data processing method, the damaged data can be repaired without occupying extra memory space. In addition, since the data recovery operation technically utilize the property of the flash memory to trace back the correct data, when the memory space damaged has occurred, the data repair rate or recovery rate can reach 100%. Therefore, before the end of the lifespan of a memory device, it can ensure that the user's data will not be lost as the memory space is damaged.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data processing method, for a memory controller coupled to a memory device and comprising a processor to control access operation of the memory device, wherein the data processing method is performed by the processor and comprises:
    maintaining a predetermined table according to a write operation of a first memory block of the memory device, wherein the first memory block is a destination memory block and the write operation of the first memory block is to write data copied from one or more source memory blocks to the destination memory block; and
    performing data protection in response to the write operation;
    wherein step of performing the data protection in response to the write operation further comprises:
    determining whether memory space damage has occurred in the first memory block, and
    when it is determined that memory space damage has occurred in the first memory block, tracing back one or more data sources of the data written in the first memory block according to the predetermined table to obtain address information of the one or more source memory blocks; and
    performing a data recovery operation according to the address information of the one or more source memory blocks,
    wherein the predetermined table is a multi-party mapping table, the multi-party mapping table comprises a plurality of multi-party mapping records, each multi-party mapping record at least comprises a first field storing a logical address, a second field storing a source physical address and a third field storing a destination physical address, for recording that data corresponding to the logical address has been moved from the corresponding source physical address to the corresponding destination physical address, and
    wherein a physical page number of the source physical address recorded in the second field of the predetermined table is different from a physical page number of the destination physical address recorded in the third field of the predetermined table.

2. The data processing method of claim 1, further comprising:
    performing the write operation of the first memory block to write data corresponding to one or more logical addresses in the first memory block; and
    updating mapping information of the one or more logical addresses in a logical-to-physical mapping table to corresponding one or more physical addresses of the first memory block,
    wherein the logical-to-physical mapping table corresponds to a plurality of logical addresses for recording the mapping information regarding which physical address the logical addresses are respectively mapped to.

3. The data processing method of claim 2, wherein when it is determined that that memory space damage has occurred in the first memory block, the data processing method further comprises:
    modifying the mapping information of the one or more logical addresses in the logical-to-physical mapping table to one or more physical addresses of the one or more source memory blocks.

4. The data processing method of claim 1, further comprising:
    performing the write operation of the first memory block to write data corresponding to one or more logical addresses in the first memory block; and
    not updating mapping information of the one or more logical addresses in a logical-to-physical mapping table to corresponding one or more physical addresses of the first memory block before determining that the memory space damage has not occurred in the first memory block,
    wherein the logical-to-physical mapping table corresponds to a plurality of logical addresses for recording the mapping information regarding which physical address the logical addresses are respectively mapped to.

5. The data processing method of claim 4, further comprising:
    updating the mapping information of the one or more logical addresses in the logical-to-physical mapping table to the corresponding one or more physical addresses of the first memory block after determining that memory space damage has not occurred in the first memory block.

6. The data processing method of claim 1, wherein the predetermined table is a logical-to-physical mapping table, the logical-to-physical mapping table corresponds to a plurality of logical addresses for recording mapping information regarding which physical address the logical addresses are respectively mapped to, and the method further comprises:
    performing the write operation of the first memory block to write data corresponding to one or more logical addresses in the first memory block; and not updating the logical-to-physical mapping table before determining that the memory space damage has not occurred in the first memory block.

7. The data processing method of claim 6, further comprising:
updating the mapping information of the one or more logical addresses in the logical-to-physical mapping table to corresponding one or more physical addresses of the first memory block after determining that memory space damage has not occurred in the first memory block.

8. The data processing method of claim 1, wherein step of determining whether memory space damage has occurred in the first memory block further comprises:
reading data stored in one or more pages of the first memory block after completing write operation of one or more pages of the first memory block and determining whether the data stored in any of the one or more pages has been damaged; and
when the data stored in any of the one or more pages has been damaged, determining that the memory space damage has occurred in the first memory block.

9. A memory controller, comprising:
a memory interface; and
a processor, coupled to the memory interface and configured to control access operation of a memory device via the memory interface,
wherein the processor is further configured to maintain a predetermined table according to a write operation of a first memory block of the memory device and perform data protection in response to the write operation, wherein the first memory block is a destination memory block and the write operation of the first memory block is to write data copied from one or more source memory blocks to the destination memory block, and
when performing the data protection, the processor is configured to determine whether memory space damage has occurred in the first memory block, and
when it is determined that memory space damage has occurred in the first memory block, the processor is configured to trace back one or more data sources of the data written in the first memory block according to the predetermined table to obtain address information of the one or more source memory blocks and perform a data recovery operation according to the address information of the one or more source memory blocks,
wherein the predetermined table is a multi-party mapping table, the multi-party mapping table comprises a plurality of multi-party mapping records, each multi-party mapping record at least comprises a first field storing a logical address, a second field storing a source physical address and a third field storing a destination physical address, for recording that data corresponding to the logical address has been moved from the corresponding source physical address to the corresponding destination physical address, and
wherein a physical page number of the source physical address recorded in the second field of the predetermined table is different from a physical page number of the destination physical address recorded in the third field of the predetermined table.

10. The memory controller of claim 9, wherein the processor is further configured to maintain a logical-to-physical mapping table, the logical-to-physical mapping table corresponds to a plurality of logical addresses for recording mapping information regarding which physical address the logical addresses are respectively mapped to, and wherein when performing the write operation of the first memory block, the processor is configured to write data corresponding to one or more logical addresses in the first memory block, and update the mapping information of the one or more logical addresses in the logical-to-physical mapping table to corresponding one or more physical addresses of the first memory block.

11. The memory controller of claim 10, wherein when it is determined that memory space damage has occurred in the first memory block, the processor is further configured to modify the mapping information of the one or more logical addresses in the logical-to-physical mapping table to one or more physical addresses of the one or more source memory blocks.

12. The memory controller of claim 9, wherein the processor is further configured to maintain a logical-to-physical mapping table, the logical-to-physical mapping table corresponds to a plurality of logical addresses for recording mapping information regarding which physical address the logical addresses are respectively mapped to, and wherein when performing the write operation of the first memory block, the processor is configured to write data corresponding to one or more logical addresses in the first memory block, and before determining that memory space damage has not occurred in the first memory block, the processor is configured not to update the mapping information of the one or more logical addresses in the logical-to-physical mapping table to corresponding one or more physical addresses of the first memory block.

13. The memory controller of claim 12, wherein when determining that memory space damage has not occurred in the first memory block, the processor is configured to update the mapping information of the one or more logical addresses in the logical-to-physical mapping table to the corresponding one or more physical addresses of the first memory block.

14. The memory controller of claim 9, wherein the predetermined table is a logical-to-physical mapping table, the logical-to-physical mapping table corresponds to a plurality of logical addresses for recording mapping information regarding which physical address the logical addresses are respectively mapped to, wherein when performing the write operation of the first memory block, the processor is configured to write data corresponding to one or more logical addresses in the first memory block, and before determining that memory space damage has not occurred in the first memory block, the processor is configured not to update the logical-to-physical mapping table.

15. The memory controller of claim 14, wherein when determining that memory space damage has not occurred in the first memory block, the processor is configured to update the mapping information of the one or more logical addresses in the logical-to-physical mapping table to corresponding one or more physical addresses of the first memory block.

16. The memory controller of claim 9, wherein after completing write operation of one or more pages of the first memory block, the processor determines whether memory space damage has not occurred in the first memory block by reading data stored in the one or more pages, and when determining that the data stored in any of the one or more pages has been damaged, the processor determines that the memory space damage has occurred in the first memory block.

17. The memory controller of claim 9, wherein when performing the data recovery operation, the processor is further configured to select a second memory block, read data that was previously written in the first memory block from the one or more source memory blocks, and write the data that is read from the one or more source memory blocks in the second memory block.

* * * * *